United States Patent
Pan et al.

(10) Patent No.: US 11,041,911 B2
(45) Date of Patent: Jun. 22, 2021

(54) SAMPLING CIRCUIT, EQUALIZATION CIRCUIT, AND SYSTEM FOR SINGLE CELL IN SERIES BATTERY PACK

(71) Applicant: Huawei Technologies Co., Ltd., Shenzhen (CN)

(72) Inventors: Denghai Pan, Dongguan (CN); Zejie Lv, Dongguan (CN); Yuanzhong Wu, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/455,714

(22) Filed: Jun. 27, 2019

(65) Prior Publication Data

US 2019/0317153 A1 Oct. 17, 2019

Related U.S. Application Data

(63) Continuation of application No. PCT/CN2017/100382, filed on Sep. 4, 2017.

(30) Foreign Application Priority Data

Dec. 31, 2016 (CN) .......................... 201611265992.6

(51) Int. Cl.
| | |
|---|---|
| G01R 31/3835 | (2019.01) |
| G01R 31/396 | (2019.01) |
| G01R 31/36 | (2020.01) |
| H02J 7/00 | (2006.01) |
| H01M 10/42 | (2006.01) |
| H01M 10/48 | (2006.01) |
| B60L 58/22 | (2019.01) |

(52) U.S. Cl.
CPC ..... *G01R 31/3835* (2019.01); *G01R 31/3648* (2013.01); *G01R 31/396* (2019.01); *H02J 7/0014* (2013.01); *B60L 58/22* (2019.02); *H01M 10/482* (2013.01); *H01M 2010/4271* (2013.01); *H02J 7/0018* (2013.01); *H02J 7/0019* (2013.01)

(58) Field of Classification Search
CPC ...... H02J 7/0014; H02J 7/0016; H02J 7/0018; H02J 7/0019; B60L 58/22; H01M 2010/4271
See application file for complete search history.

(56) References Cited

U.S. PATENT DOCUMENTS

| | | | |
|---|---|---|---|
| 4,797,599 A | 1/1989 | Ference et al. | |
| 5,712,568 A * | 1/1998 | Flohr | G01R 31/396 |
| | | | 324/434 |

(Continued)

FOREIGN PATENT DOCUMENTS

| | | |
|---|---|---|
| CN | 201536139 U | 7/2010 |
| CN | 102170154 A | 8/2011 |

(Continued)

*Primary Examiner* — David V Henze-Gongola
*Assistant Examiner* — Tarikh Kanem Rankine
(74) *Attorney, Agent, or Firm* — Leydig, Voit & Mayer, Ltd.

(57) ABSTRACT

In a sampling circuit, a single cell in a series battery pack is isolated from a voltage divider resistor in a bleeder circuit by using a first isolation sampling switch, so as to prevent a drain current of the single cell. In addition, sampling errors in sampling voltages collected by the sampling circuit may be offset during differential calculation.

13 Claims, 12 Drawing Sheets

(56) References Cited

U.S. PATENT DOCUMENTS

| | | | | |
|---|---|---|---|---|
| 5,850,351 | A * | 12/1998 | Lotfy | H02J 7/0022 700/286 |
| 5,914,606 | A * | 6/1999 | Becker-Irvin | G01R 15/04 324/434 |
| 6,025,695 | A * | 2/2000 | Friel | H01M 10/4257 320/106 |
| 6,191,555 | B1 * | 2/2001 | Konishi | H02J 7/0016 320/118 |
| 6,362,626 | B2 * | 3/2002 | Furukawa | G01R 31/396 324/429 |
| 2006/0012336 | A1 * | 1/2006 | Fujita | B60L 58/18 320/119 |
| 2006/0091854 | A1 * | 5/2006 | Chen | H02J 7/0021 320/116 |
| 2007/0120529 | A1 | 5/2007 | Ishikawa et al. | |
| 2007/0170889 | A1 | 7/2007 | Ishikawa et al. | |
| 2008/0111556 | A1 | 5/2008 | Yano | |
| 2008/0164880 | A1 | 7/2008 | Jaeger et al. | |
| 2010/0039072 | A1 * | 2/2010 | Cegnar | H01G 9/155 320/167 |
| 2010/0045299 | A1 * | 2/2010 | Heeringa | G01R 31/3835 324/434 |
| 2010/0090653 | A1 * | 4/2010 | Kuwano | B60L 3/0046 320/136 |
| 2010/0134068 | A1 * | 6/2010 | Lim | H02J 7/0016 320/116 |
| 2010/0134069 | A1 * | 6/2010 | Oosawa | H02J 7/0021 320/118 |
| 2010/0207579 | A1 * | 8/2010 | Lee | H02J 7/0018 320/120 |
| 2011/0285352 | A1 * | 11/2011 | Lim | H02J 7/0019 320/118 |
| 2011/0285538 | A1 * | 11/2011 | Lee | G01R 31/28 340/636.1 |
| 2012/0025835 | A1 * | 2/2012 | Chandler | B60L 58/22 324/433 |
| 2012/0032641 | A1 | 2/2012 | Yun et al. | |
| 2012/0086390 | A1 * | 4/2012 | Lim | H02J 7/0019 320/107 |
| 2012/0139495 | A1 * | 6/2012 | Nortman | H02J 7/0016 320/128 |
| 2012/0194135 | A1 * | 8/2012 | Mizoguchi | G01R 31/396 320/118 |
| 2012/0194199 | A1 * | 8/2012 | Mizoguchi | G01R 31/396 324/433 |
| 2012/0253716 | A1 * | 10/2012 | Tsuchiya | B60L 58/22 702/63 |
| 2012/0286722 | A1 * | 11/2012 | Kabasawa | H02J 7/0018 320/107 |
| 2013/0057198 | A1 * | 3/2013 | Gerlovin | H02J 7/0019 320/103 |
| 2013/0057294 | A1 * | 3/2013 | Mizoguchi | B60L 58/15 324/434 |
| 2013/0093400 | A1 * | 4/2013 | Maynard | H02J 15/00 320/166 |
| 2013/0141048 | A1 * | 6/2013 | Huang | H02J 7/0018 320/118 |
| 2013/0162213 | A1 | 6/2013 | Izawa | |
| 2013/0207663 | A1 * | 8/2013 | Wiesner | G01R 31/382 324/426 |
| 2013/0221900 | A1 | 8/2013 | Hwang | |
| 2013/0335095 | A1 | 12/2013 | Kiuchi | |
| 2013/0342214 | A1 * | 12/2013 | Lin | G01R 31/396 324/434 |
| 2014/0152261 | A1 | 6/2014 | Yamauchi et al. | |
| 2014/0266221 | A1 * | 9/2014 | Baughman | G01R 31/3835 324/426 |
| 2014/0266222 | A1 * | 9/2014 | Baughman | H02J 7/00 324/426 |
| 2015/0061409 | A1 * | 3/2015 | Dunton | H02J 3/383 307/115 |
| 2016/0313406 | A1 * | 10/2016 | Lin | G01R 31/382 |
| 2017/0160347 | A1 * | 6/2017 | Wiesner | H01M 10/482 |

FOREIGN PATENT DOCUMENTS

| | | | |
|---|---|---|---|
| CN | 102780242 A | | 11/2012 |
| CN | 102810892 A | | 12/2012 |
| CN | 103231700 A | | 8/2013 |
| CN | 104065112 A | | 9/2014 |
| CN | 204089176 U | * | 1/2015 |
| CN | 204089176 U | | 1/2015 |
| CN | 104901371 A | | 9/2015 |
| CN | 104935051 A | | 9/2015 |
| CN | 205160157 U | | 4/2016 |
| CN | 106786944 A | | 5/2017 |
| WO | 2015020084 A1 | | 2/2015 |

* cited by examiner

SAMPLING CIRCUIT, EQUALIZATION CIRCUIT, AND SYSTEM FOR SINGLE CELL IN SERIES BATTERY PACK

CROSS-REFERENCE TO RELATED APPLICATIONS

This application is a continuation of International Application No. PCT/CN2017/100382, filed on Sep. 4, 2017, which claims priority to Chinese Patent Application No. 201611265992.6, filed on Dec. 31, 2016. The disclosures of the aforementioned applications are hereby incorporated by reference in their entireties.

TECHNICAL FIELD

Embodiments of the present invention relate to the field of battery technologies, and in particular, to a sampling circuit, an equalization circuit, and a system for a single cell in a series battery pack.

BACKGROUND

A lithium-ion battery pack generally includes a plurality of single lithium-ion batteries that are connected in series or parallel. Because of inconsistency of features of the single cells, voltages of the single cells need to be collected to improve battery usage performance, prolong a service life, and perform charging and discharging safety management. If the voltages of the single cells differ, an equalization circuit needs to be started to perform charging and discharging management on the single cells, so that the single cells in the battery pack tend to have a consistent voltage. Voltage sampling precision of the single cells in the lithium-ion battery pack is generally required to be within 10 mV. In addition, sampling and equalization circuits require a low drain current (less than 500 μA) to ensure a battery storage time.

Currently, during sampling of a single cell, a voltage of the single cell in a series battery pack is mostly sampled by using a common mode voltage division method. In this sampling method, a circuit is simple, a battery and a processor can be common-grounded, and there is no need to isolate communication. However, because a single cell in a battery pack is always connected to a sampling resistor, a continuous drain current exists, and consequently a battery storage time requirement cannot be met.

SUMMARY

Embodiments of the present invention provide a sampling circuit, an equalization circuit, and a system for a single cell in a series battery pack, so as to isolate a single cell from a sampling resistor to prevent a drain current of the single cell when no sampling is performed on the single cell.

According to a first aspect, a sampling circuit for a single cell in a series battery pack is provided.

The sampling circuit includes a controller, an analog-to-digital converter (ADC), a bleeder circuit, a battery pack including n single cells connected in series, and n isolation sampling switches. One end of each of the n isolation sampling switches is connected to a first input end of the bleeder circuit, the other ends of the n isolation sampling switches are respectively connected to positive electrodes of the n single cells, and the isolation sampling switches are in a one-to-one correspondence with the single cells. A negative electrode of a first single cell in the n single cells is connected to a second input end of the bleeder circuit, and is grounded. An output end of the bleeder circuit is connected to a second input end of the ADC, a first input end of the ADC is grounded, and an output end of the ADC is connected to an input end of the controller. A first output group of the controller is separately connected to control ends of the n isolation sampling switches to control the n isolation sampling switches to be open or closed. The controller sequentially controls the n isolation sampling switches to be closed, and sends voltages to earth of the positive electrodes of the n single cells corresponding to the n isolation sampling switches to the ADC for conversion after the voltages to earth are attenuated by the bleeder circuit. The ADC transmits converted sampling voltage values to the controller, and the controller subtracts two adjacent sampling voltage values to obtain a voltage value of a corresponding single cell.

The single cell is isolated from a voltage divider resistor in the bleeder circuit by using the first isolation sampling switch, so as to prevent a drain current of the single cell. In addition, sampling errors in sampling voltages collected by the sampling circuit may be offset during differential calculation, thereby improving voltage sampling precision of the single cell.

With reference to the first aspect, in a first possible implementation of the first aspect, the bleeder circuit includes a first voltage divider resistor and a second voltage divider resistor. One end of the first voltage divider resistor is connected to the n isolation sampling switches, and the other end is connected to the second input end of the ADC. One end of the second voltage divider resistor is connected to the negative electrode of the first single cell in the n single cells, and the other end is connected to the second input end of the ADC.

The voltage to earth of the positive electrode of the single cell may be attenuated by using the first voltage divider resistor and the second voltage divider resistor in the bleeder circuit.

With reference to the first aspect or the first possible implementation of the first aspect, in a second possible implementation of the first aspect, the sampling circuit further includes an auxiliary driving power supply. Any one of the n isolation sampling switches includes a first transistor, a second transistor, and an opto-isolator. A first port of the first transistor is connected to a first port of the second transistor, a second port of the first transistor is connected to a first port of the opto-isolator, and a third port of the first transistor is connected to a positive electrode of a single cell corresponding to the first transistor. A second port of the second transistor is connected to the first port of the opto-isolator, and a third port of the second transistor is connected to the first input end of a bleeder circuit. A second port of the opto-isolator and the controller are common-grounded, a third port of the opto-isolator is connected to the first output group of the controller, and a fourth port of the opto-isolator is connected to a positive electrode of the auxiliary driving power supply. A negative electrode of the auxiliary driving power supply is connected to the first input end of the bleeder circuit.

The single cell is isolated from the voltage divider resistor in the bleeder circuit by using the first transistor and the second transistor in the first isolation sampling switch, so as to prevent a drain current of the single cell. In addition, sampling errors in sampling voltages collected by the sampling circuit may be offset during differential calculation, thereby improving voltage sampling precision of the single cell.

With reference to the first aspect or the second possible implementation of the first aspect, in a third possible implementation of the first aspect, the first transistor and the second transistor are N-channel metal oxide semiconductors.

With reference to the first aspect or the first possible implementation of the first aspect, in a fourth possible implementation of the first aspect, any one of the n isolation sampling switches includes a third transistor, a fourth transistor, and an opto-isolator. A first port of the third transistor is connected to a first port of the fourth transistor, a second port of the third transistor is connected to a fourth port of the opto-isolator, and a third port of the third transistor is connected to a positive electrode of a single cell corresponding to the third transistor. A second port of the fourth transistor is connected to the fourth port of the opto-isolator, and a third port of the fourth transistor is connected to the first input end of a bleeder circuit. A first port of the opto-isolator is connected to a negative electrode of a single cell corresponding to the opto-isolator, a second port of the opto-isolator and the controller are common-grounded, and a third port of the opto-isolator is connected to the first output group of the controller.

The single cell is isolated from the voltage divider resistor in the bleeder circuit by using the third transistor and the fourth transistor in the first isolation sampling switch, so as to prevent a drain current of the single cell. In addition, sampling errors in sampling voltages collected by the sampling circuit may be offset during differential calculation, thereby improving voltage sampling precision of the single cell.

With reference to the first aspect or the fourth possible implementation of the first aspect, in a fifth possible implementation of the first aspect, the third transistor and the fourth transistor are P-channel metal oxide semiconductors.

According to a second aspect, a sampling circuit for a single cell in a series battery pack is provided.

The sampling circuit includes a controller, an ADC with communication isolation, a battery pack including n single cells connected in series, n first isolation sampling switches, and n second isolation sampling switches. One end of each of the n first isolation sampling switches is connected to a first input end of the ADC with communication isolation, the other ends of the n first isolation sampling switches are respectively connected to positive electrodes of the n single cells, and the first isolation sampling switches are in a one-to-one correspondence with the single cells. One end of each of the n second isolation sampling switches is connected to a second input end of the ADC with communication isolation, the other ends of the n second isolation sampling switches are respectively connected to negative electrodes of the n single cells, and the second isolation sampling switches are in a one-to-one correspondence with the single cells. An output end of the ADC with communication isolation is connected to an input end of the controller. A first output group of the controller is separately connected to control ends of the n first isolation sampling switches and control ends of the n second isolation sampling switches to control the n isolation sampling switches to be open or closed. The controller sequentially controls closure of the first isolation sampling switches and the second isolation sampling switches that are connected to all the single cells, and may sequentially send voltages of all the single cells to the ADC with communication isolation for conversion, and sampling voltage values of all the single cells that are converted by the ADC are isolated and transmitted to the controller.

By using the first isolation sampling switch and the second isolation sampling switch, a voltage of a single cell that needs to be measured can be connected to positive and negative common nodes, and is transmitted to the controller after being converted by the ADC with communication isolation. Therefore, high-precision differential sampling of the voltage of the single cell can be implemented.

With reference to the second aspect, in a first possible implementation of the second aspect, the sampling circuit further includes an auxiliary driving power supply. Any one of the n first isolation sampling switches and the n second isolation sampling switches includes a first transistor, a second transistor, and an opto-isolator. A first port of the first transistor is connected to a first port of the second transistor, a second port of the first transistor is connected to a first port of the opto-isolator, and a third port of the first transistor is connected to a positive electrode of a single cell corresponding to the first transistor. A second port of the second transistor is connected to the first port of the opto-isolator, and a third port of the second transistor is connected to a first input end of the bleeder circuit. A second port of the opto-isolator and the controller are common-grounded, a third port of the opto-isolator is connected to the first output group of the controller, and a fourth port of the opto-isolator is connected to a positive electrode of the auxiliary driving power supply. A negative electrode of the auxiliary driving power supply is connected to the second input end of the ADC.

With reference to the second aspect or the first possible implementation of the second aspect, in a second possible implementation of the second aspect, the first transistor and the second transistor are N-channel metal oxide semiconductors.

With reference to the second aspect, in a third possible implementation of the second aspect, any one of the n first isolation sampling switches and the n second isolation sampling switches includes a third transistor, a fourth transistor, and an opto-isolator. A first port of the third transistor is connected to a first port of the fourth transistor, a second port of the third transistor is connected to a fourth port of the opto-isolator, and a third port of the third transistor is connected to a positive electrode of a single cell corresponding to the third transistor. A second port of the fourth transistor is connected to the fourth port of the opto-isolator, and a third port of the fourth transistor is connected to a first input end of the bleeder circuit. A first port of the opto-isolator is connected to a negative electrode of a single cell corresponding to the opto-isolator, a second port of the opto-isolator and the controller are common-grounded, and a third port of the opto-isolator is connected to the first output group of the controller.

With reference to the second aspect or the third possible implementation of the second aspect, in a fourth possible implementation of the second aspect, the first transistor and the second transistor are P-channel metal oxide semiconductors.

According to a third aspect, an equalization circuit for a single cell in a series battery pack is provided.

The equalization circuit is applied to the sampling circuit in any implementation of the first aspect or the second aspect, and includes a controller, a battery pack including n single cells connected in series, n equalization switches, and n equalization resistors. Any one of the n single cells is connected in series to one equalization switch and one equalization resistor. A second output group of the controller is separately connected to control ends of the n equalization switches to control the n equalization switches to be open or closed. The controller controls, based on a sampling voltage value of each single cell that is collected by the sampling circuit and a preset battery equalization algorithm, connection of an equalization switch of a single cell that needs to be equalized, so that electric energy of the single cell that needs to be equalized is released by using the equalization resistor.

With reference to the third aspect, in a first possible implementation of the third aspect, any one of the n equalization switches includes a fifth transistor, a second opto-isolator, and a first resistor. A first port of the fifth transistor is connected to a first port of the second opto-isolator by using the first resistor, a second port of the fifth transistor is connected to the first port of the second opto-isolator, and a third port of the fifth transistor is connected to a fourth port of the second opto-isolator by using the equalization resistor. The first port of the second opto-isolator is connected to a negative electrode of a single cell corresponding to the second opto-isolator, a second port of the second opto-isolator is grounded, a third port of the second opto-isolator is connected to the second output group of the controller, and the fourth port of the second opto-isolator is connected to a positive electrode of the single cell corresponding to the second opto-isolator.

With reference to the third aspect or the first possible implementation of the third aspect, in a second possible implementation of the third aspect, the fifth transistor is an N-channel metal oxide semiconductor.

With reference to the third aspect, in a third possible implementation of the third aspect, any one of the n equalization switches includes a sixth transistor, a second opto-isolator, and a second resistor. A first port of the sixth transistor is connected to a first port of the second opto-isolator by using the second resistor, a second port of the sixth transistor is connected to the first port of the second opto-isolator, and a third port of the sixth transistor is connected to a fourth port of the second opto-isolator by using the equalization resistor. The first port of the second opto-isolator is connected to a positive electrode of a single cell corresponding to the second opto-isolator, a second port of the second opto-isolator is grounded, a third port of the second opto-isolator is connected to the second output group of the controller, and the fourth port of the second opto-isolator is connected to a negative electrode of the single cell corresponding to the second opto-isolator.

With reference to the third aspect or the third possible implementation of the third aspect, in a fourth possible implementation of the third aspect, the sixth transistor is a P-channel metal oxide semiconductor.

According to a fourth aspect, a sampling equalization system for a single cell in a series battery pack is provided.

The sampling equalization system includes the sampling circuit in any implementation of the first aspect or the second aspect and the equalization circuit in any implementation of the third aspect. The controller performs, based on a voltage value of each single cell that is collected by the sampling circuit and a preset battery equalization algorithm, equalization control on a single cell that needs to be equalized.

DESCRIPTION OF EMBODIMENTS

Figure 1:
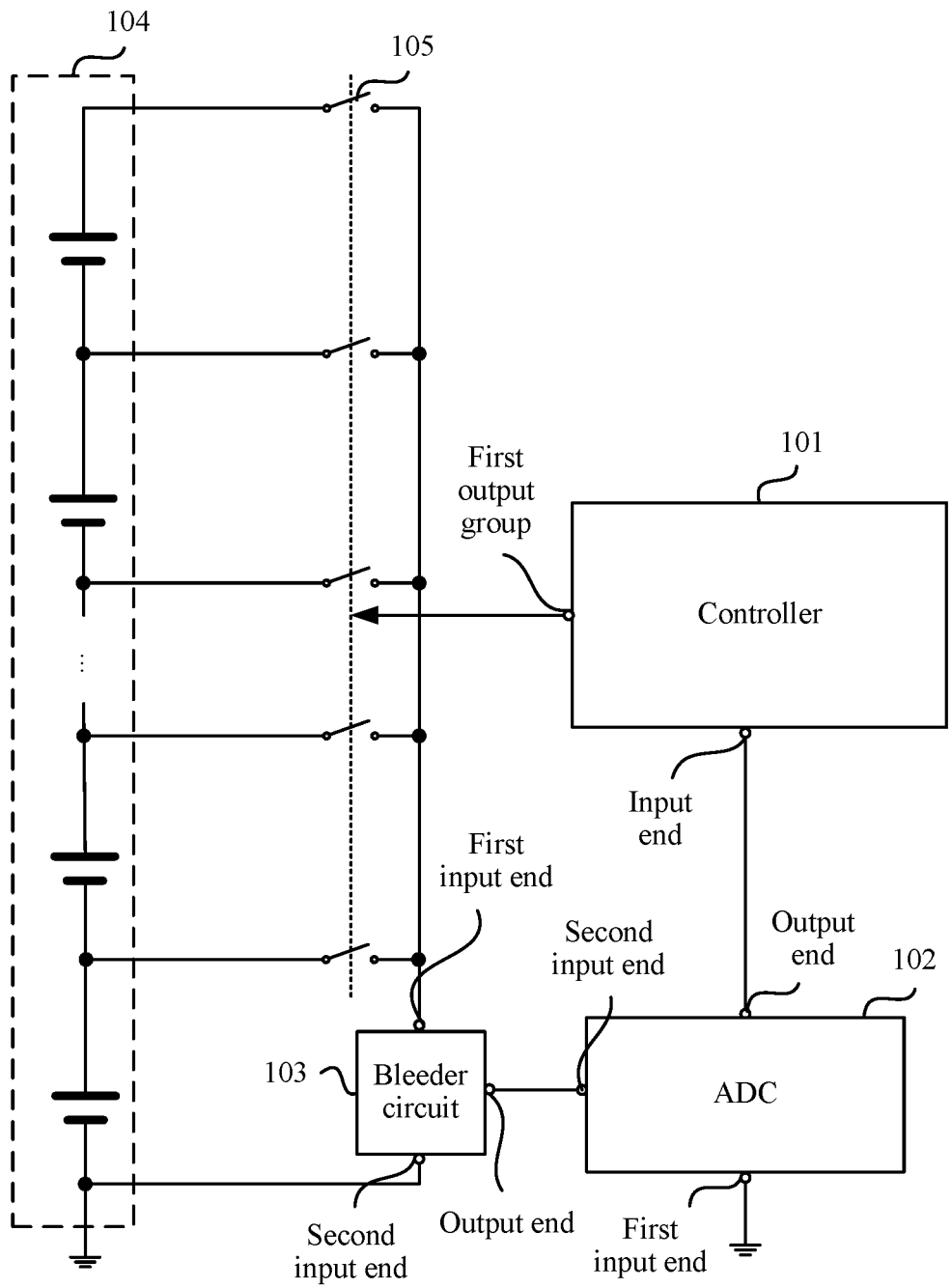
FIG. 1 is a schematic structural diagram of a sampling circuit for a single cell in a series battery pack according to an embodiment of the present invention.

FIG. 1 shows an example of a structure of a sampling circuit for a single cell in a series battery pack according to an embodiment of the present invention. The sampling circuit may collect a voltage to earth of a positive electrode of a single cell in a battery pack. A sampling method in this embodiment of the present invention is a common mode voltage division sampling method.

As shown in FIG. 1, the sampling circuit may include a controller 101, an ADC 102, a bleeder circuit 103, a battery pack 104 including n single cells connected in series, and n isolation sampling switches 105.

One end of any one of the n isolation sampling switches 105 is connected to a first input end of the bleeder circuit 103, the other end of each of the isolation sampling switches 105 is connected to a positive electrode of each single cell, and the isolation sampling switches 105 are in a one-to-one correspondence with the single cells. In the n single cells, a negative electrode of a first single cell is connected to a second input end of the bleeder circuit 103, and is grounded. An output end of the bleeder circuit 103 is connected to a second input end of the ADC 102, a first input end of the ADC 102 is grounded, and an output end of the ADC 102 is connected to an input end of the controller 101. A first output group of the controller 101 is separately connected to control ends of the n isolation sampling switches 105 to control the n isolation sampling switches 105 to be open or closed. The controller 101 sequentially controls the n isolation sampling switches 105 to be closed, and sends voltages to earth of positive electrodes of the n single cells corresponding to the n isolation sampling switches 105 to the ADC 102 for conversion after the voltages to earth are attenuated by the bleeder circuit. The ADC 102 transmits converted sampling voltage values to the controller 101. The controller 101 subtracts two adjacent sampling voltage values to obtain a voltage value of a corresponding single cell.

In the sampling circuit, the single cell is isolated from a voltage divider resistor in the bleeder circuit by using the isolation sampling switch, so as to prevent a drain current when no sampling is performed on the single cell. Because the two adjacent sampling voltage values have a basically same sampling error, the sampling error is eliminated in a process of subtracting the two adjacent sampling voltage values, and therefore voltage sampling precision of the single cell is improved.

Figure 2:
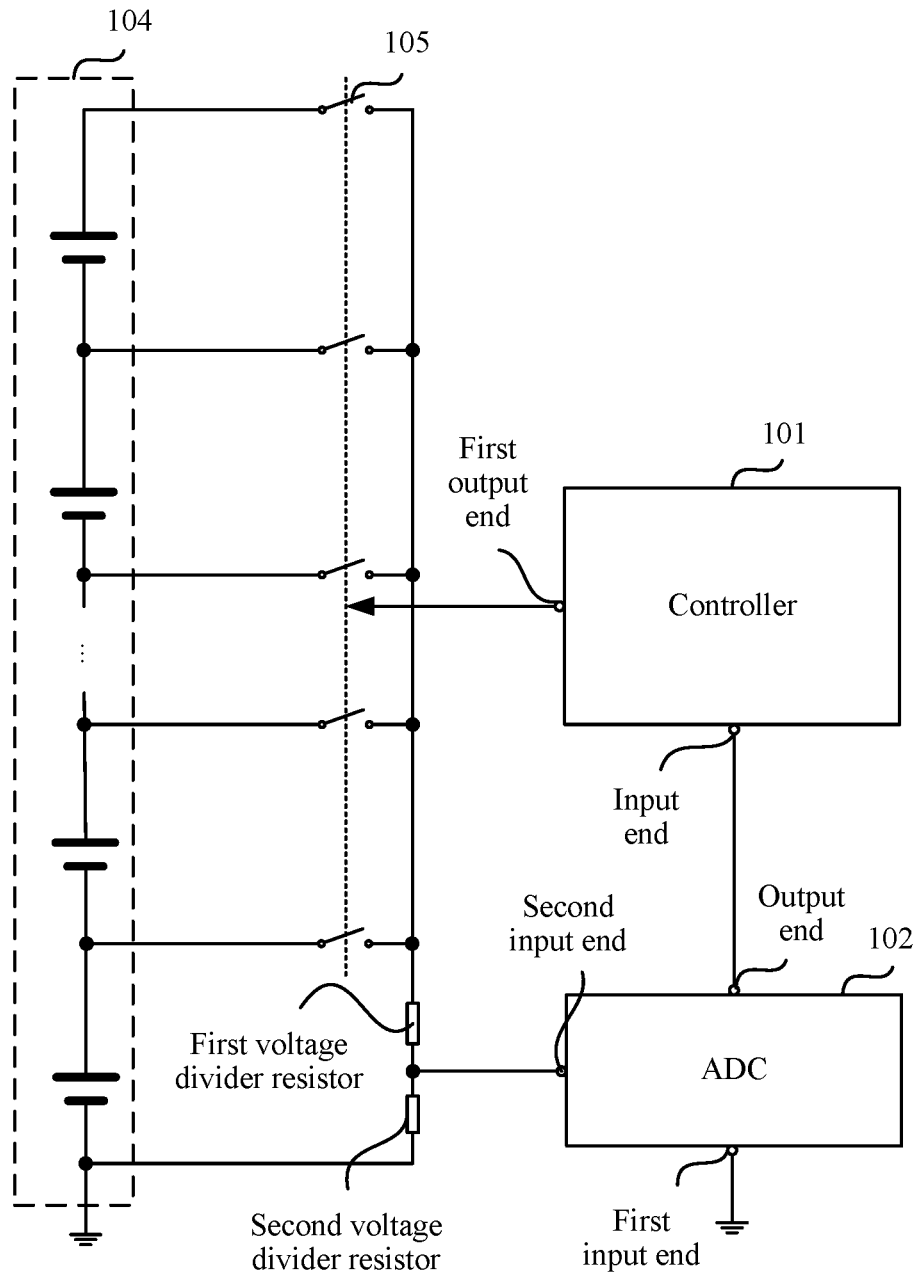
FIG. 2 is a schematic structural diagram of a sampling circuit for a single cell in a series battery pack according to an embodiment of the present invention.

FIG. 2 shows an example of a structure of a bleeder circuit. As shown in FIG. 2, the bleeder circuit may include a first voltage divider resistor and a second voltage divider resistor. One end of the first voltage divider resistor is connected to the n isolation sampling switches, and the other end is connected to the second input end of the ADC 102. One end of the second voltage divider resistor is connected to the negative electrode of the first single cell in the n single cells, and the other end is connected to the second input end of the ADC 102.

To implement an isolation function of an isolation sampling switch, this embodiment of the present invention provides an isolation sampling switch that includes an N-channel metal oxide semiconductor (NMOS) and an opto-isolator. To supply power to the isolation sampling switch, the sampling circuit further includes an auxiliary driving power supply. In this embodiment of the present invention, both a first transistor and a second transistor are N-channel metal oxide semiconductors.

Specifically, any one of the n isolation sampling switches includes a first transistor, a second transistor, and an opto-isolator. A first port of the first transistor is connected to a first port of the second transistor, a second port of the first transistor is connected to a first port of the opto-isolator, and a third port of the first transistor is connected to a positive electrode of a single cell corresponding to the first transistor. A second port of the second transistor is connected to the first port of the opto-isolator, and a third port of the second transistor is connected to the first input end of the bleeder circuit. A second port of the opto-isolator and the controller are common-grounded, a third port of the opto-isolator is connected to the first output group of the controller, a fourth port of the opto-isolator is connected to a positive electrode of the auxiliary driving power supply, and a negative electrode of the auxiliary driving power supply is connected to the first input end of the bleeder circuit.

Figure 3:
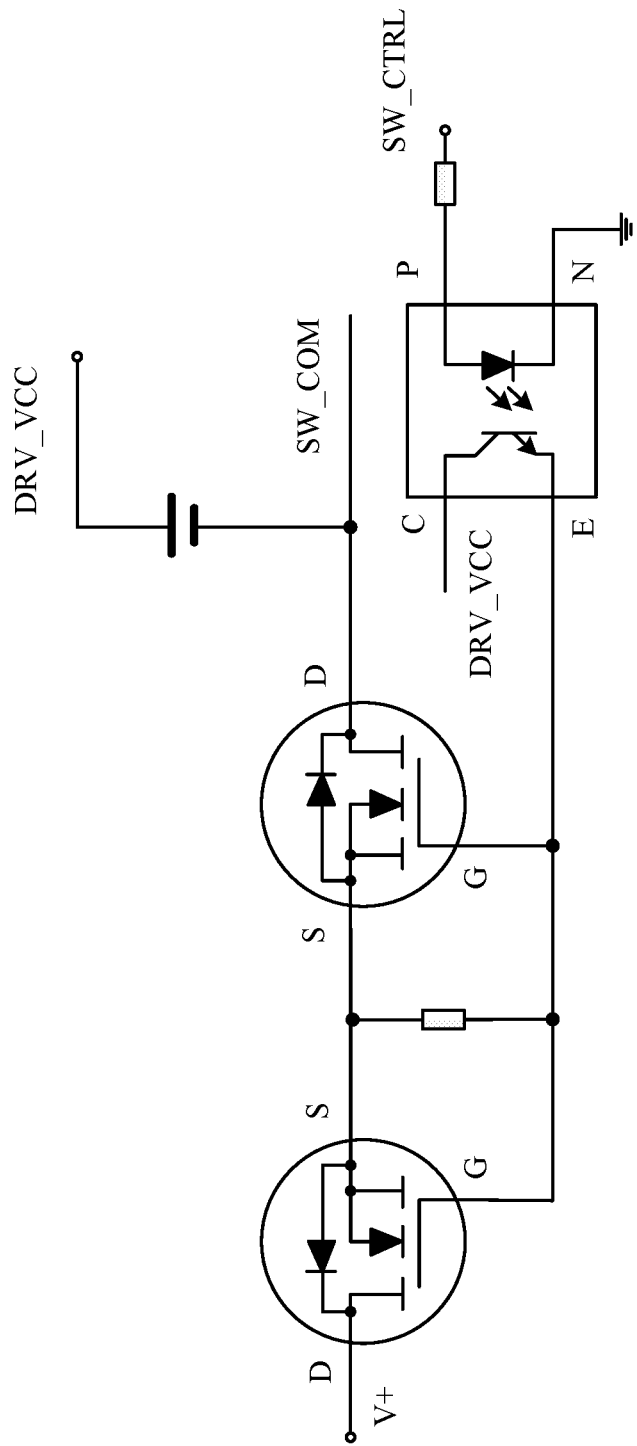
FIG. 3 is a schematic structural diagram of an isolation sampling switch according to an embodiment of the present invention.

A first port S of a first transistor of an isolation sampling switch shown in FIG. 3 is connected to a first port S of a second transistor, a second port G of the first transistor is connected to a first port E of an opto-isolator, and a third port D of the first transistor is connected to a positive electrode V+ of a single cell corresponding to the first transistor. A second port G of the second transistor is connected to the first port E of the opto-isolator, and a third port D of the second transistor is connected to the first input end SW_COM of the bleeder circuit. A second port N of the opto-isolator and the controller are common-grounded, a third port P of the opto-isolator is connected to the first output group of the controller, a fourth port C of the opto-isolator is connected to the positive electrode DRV_VCC of the auxiliary driving power supply, and the negative electrode of the auxiliary driving power supply is connected to the first input end SW_COM of the bleeder circuit.

In the sampling circuit, the single cell may be isolated from the voltage divider resistor in the bleeder circuit by using the isolation sampling switch that includes two NMOSs and an opto-isolator, so as to prevent a drain current when no sampling is performed on the single cell corresponding to the isolation sampling switch.

Correspondingly, this embodiment of the present invention further provides another isolation sampling switch that includes a P-channel metal oxide semiconductor (PMOS), and an opto-isolator. In this embodiment of the present invention, both a third transistor and a fourth transistor are PMOSs.

The isolation sampling switch may include a third transistor, a fourth transistor, and an opto-isolator. A first port of the third transistor is connected to a first port of the fourth transistor, a second port of the third transistor is connected to a fourth port of the opto-isolator, and a third port of the third transistor is connected to a positive electrode of a single cell corresponding to the third transistor. A second port of the fourth transistor is connected to the fourth port of the opto-isolator, and a third port of the fourth transistor is connected to the first input end of the bleeder circuit. A first port of the opto-isolator is connected to a negative electrode of a single cell corresponding to the opto-isolator, a second port of the opto-isolator and the controller are common-grounded, and a third port of the opto-isolator is connected to the first output group of the controller.

Figure 4:
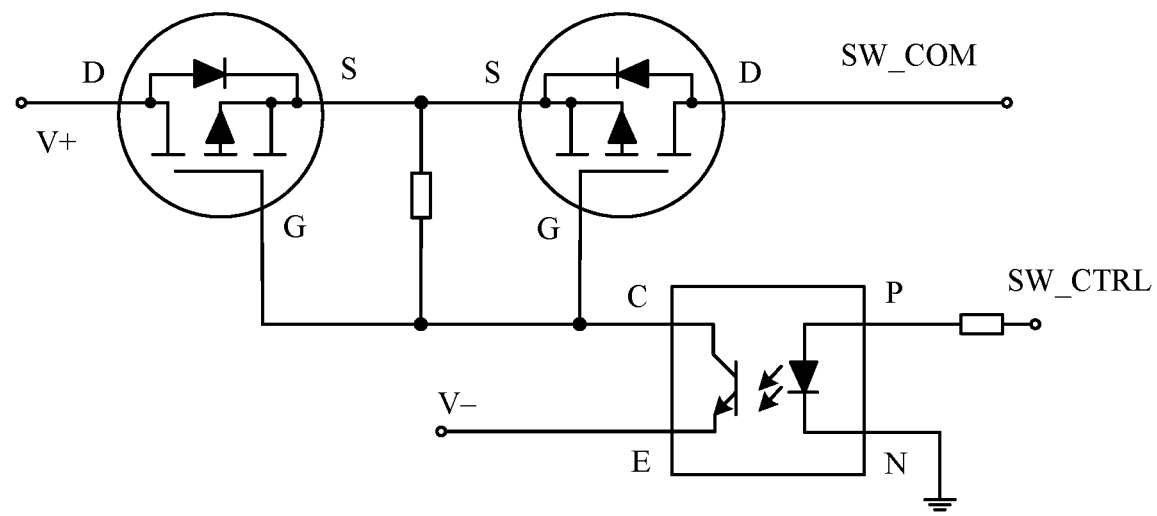
FIG. 4 is a schematic structural diagram of another isolation sampling switch according to an embodiment of the present invention.

A first port S of a third transistor of an isolation sampling switch shown in FIG. 4 is connected to a first port S of a fourth transistor, a second port G of the third transistor is connected to a fourth port C of an opto-isolator, and a third port D of the third transistor is connected to a positive electrode V+ of a single cell corresponding to the third transistor. A second port G of the fourth transistor is connected to the fourth port C of the opto-isolator, and a third port D of the fourth transistor is connected to the first input end SW_COM of the bleeder circuit. A first port E of the opto-isolator is connected to a negative electrode V_ of a single cell corresponding to the opto-isolator, a second port N of the opto-isolator and the controller are common-grounded, and a third port P of the opto-isolator is connected to the first output group of the controller.

In the sampling circuit, the single cell may be isolated from the voltage divider resistor in the bleeder circuit by using the isolation sampling switch that includes two PMOSs and an opto-isolator, so as to prevent a drain current when no sampling is performed on the single cell corresponding to the isolation sampling switch.

Figure 5:
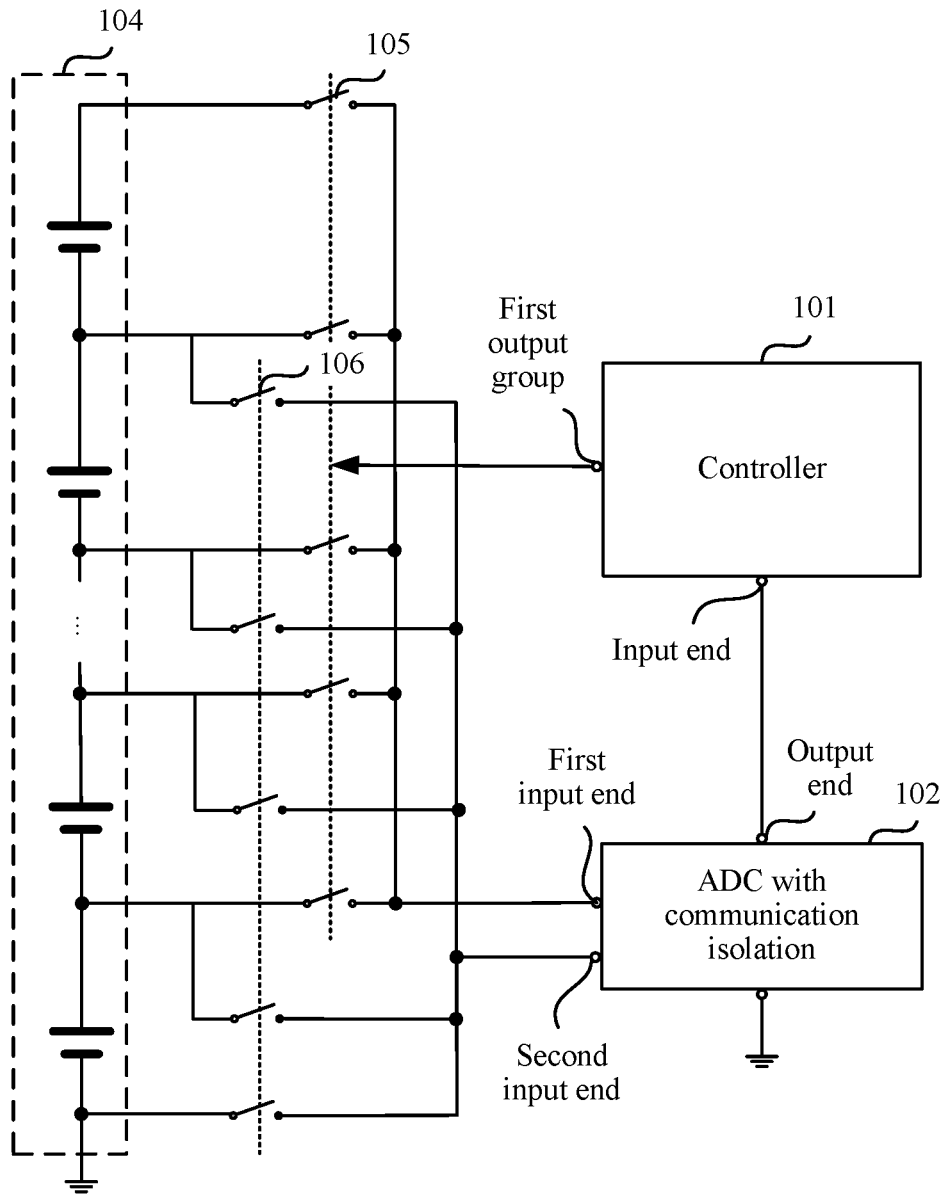
FIG. 5 is a schematic structural diagram of another sampling circuit for a single cell in a series battery pack according to an embodiment of the present invention.

Based on a same technical concept, FIG. 5 shows an example of a structure of a sampling circuit for a single cell in a series battery pack according to an embodiment of the present invention. The sampling circuit may implement isolation sampling of a single cell in a series battery pack. A sampling method provided in this embodiment of the present invention is a differential mode sampling method.

As shown in FIG. 5, the sampling circuit includes a controller 101, an ADC 102 with communication isolation, a battery pack 104 including n single cells connected in series, n first isolation sampling switches 105, and n second isolation sampling switches 106.

One end of each of the n first isolation sampling switches 105 is connected to a first input end of the ADC 102 with communication isolation, the other ends of the n first isolation sampling switches 105 are respectively connected to positive electrodes of the n single cells, and the first isolation sampling switches 105 are in a one-to-one correspondence with the single cells. One end of each of the n second isolation sampling switches 106 is connected to a second input end of the ADC 102 with communication isolation, the other ends of the n second isolation sampling switches 106 are respectively connected to negative electrodes of the n single cells, and the second isolation sampling switches 106 are in a one-to-one correspondence with the single cells. An output end of the ADC 102 with communication isolation is connected to an input end of the controller 101. A first output group of the controller 101 is separately connected to control ends of the n first isolation sampling switches 105 and control ends of the n second isolation sampling switches 106 to control the n isolation sampling switches to be open or closed. The controller 101 sequentially controls closure of the first isolation sampling switches 105 and the second isolation sampling switches 106 that are connected to all the single cells, and may sequentially send voltages of all the single cells to the ADC 102 with communication isolation for conversion. Sampling voltage values of all the single cells that are converted by the ADC 102 are isolated and transmitted to the controller.

To implement an isolation function of an isolation sampling switch, this embodiment of the present invention provides an isolation sampling switch that includes an NMOS and an opto-isolator. To supply power to the isolation sampling switch, the sampling circuit further includes an auxiliary driving power supply. In this embodiment of the present invention, both a first transistor and a second transistor may be N-channel metal-oxide-semiconductor field-effect transistors (MOSFET).

Specifically, any one of the n first isolation sampling switches and the n second isolation sampling switches includes a first transistor, a second transistor, and an opto-isolator. A first port of the first transistor is connected to a first port of the second transistor, a second port of the first transistor is connected to a first port of the opto-isolator, and a third port of the first transistor is connected to a positive electrode of a single cell corresponding to the first transistor. A second port of the second transistor is connected to the first port of the opto-isolator, and a third port of the second transistor is connected to a first input end of a bleeder circuit. A second port of the opto-isolator and the controller are common-grounded, a third port of the opto-isolator is connected to the first output group of the controller, and a fourth port of the opto-isolator is connected to a positive electrode of the auxiliary driving power supply. A negative electrode of the auxiliary driving power supply is connected to the second input end of the ADC.

An exemplary structure of the isolation sampling switch is shown in FIG. 3. An exemplary connection relationship is described in the foregoing embodiment, and details are not described again.

Correspondingly, this embodiment of the present invention further provides another isolation sampling switch that includes a PMOS and an opto-isolator. In this embodiment of the present invention, both a third transistor and a fourth transistor are PMOSs.

Any one of the n first isolation sampling switches and the n second isolation sampling switches may include a third transistor, a fourth transistor, and an opto-isolator. A first port of the third transistor is connected to a first port of the fourth transistor, a second port of the third transistor is connected to a fourth port of the opto-isolator, and a third port of the third transistor is connected to a positive electrode of a single cell corresponding to the third transistor. A second port of the fourth transistor is connected to the fourth port of the opto-isolator, and a third port of the fourth transistor is connected to a first input end of a bleeder circuit. A first port of the opto-isolator is connected to a negative electrode of a single cell corresponding to the opto-isolator, a second port of the opto-isolator and the controller are common-grounded, and a third port of the opto-isolator is connected to the first output group of the controller.

An exemplary structure of the isolation sampling switch is shown in FIG. 4. An exemplary connection relationship is described in the foregoing embodiment, and details are not described again.

Figure 6:
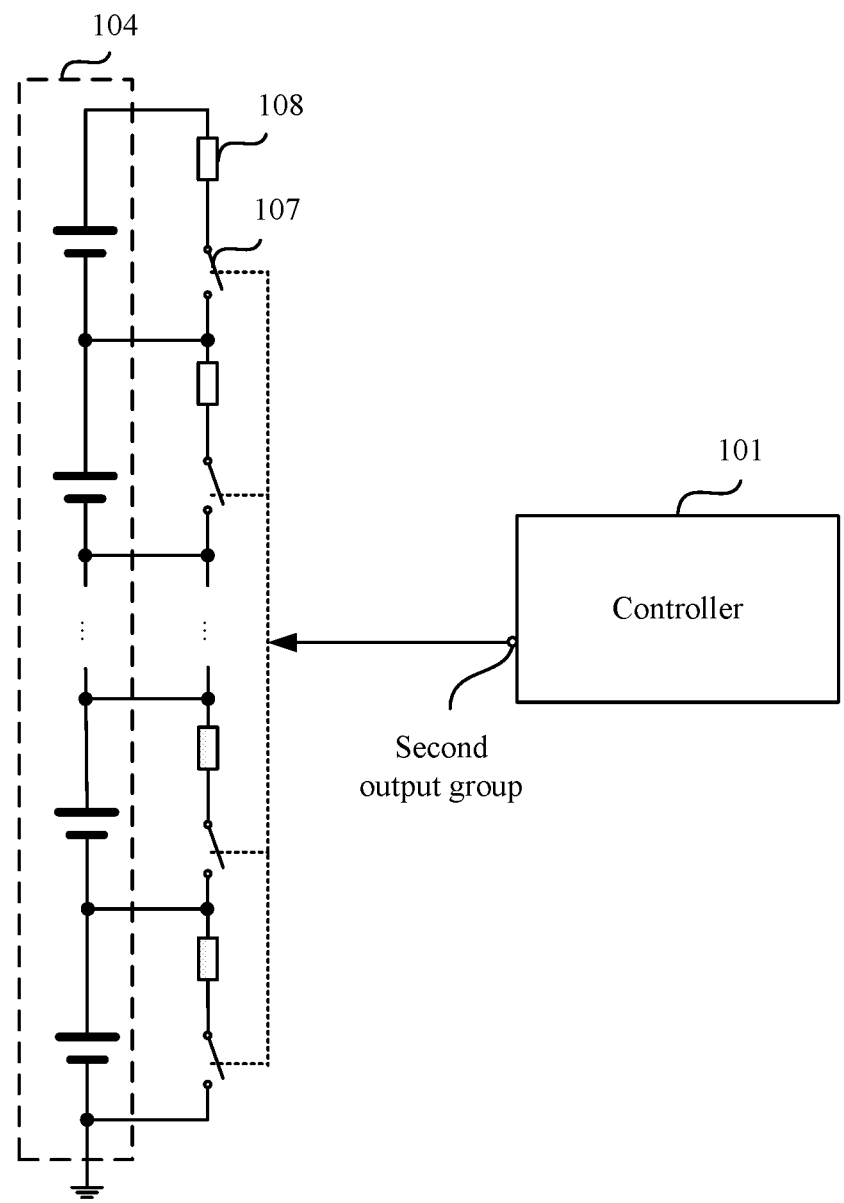
FIG. 6 is a schematic structural diagram of an equalization circuit for a single cell in a series battery pack according to an embodiment of the present invention.

To implement equalization management on a single cell in a series battery pack, FIG. 6 shows an example of an equalization circuit for a single cell in a series battery pack according to an embodiment of the present invention. The equalization circuit may control voltages of all single cells to tend to be consistent.

As shown in FIG. 6, the equalization circuit may include a controller 101, a battery pack 104 including n single cells connected in series, n equalization switches 107, and n equalization resistors 108. Any one of the n single cells is connected in series to one equalization switch 107 and one equalization resistor 108. A second output group of the controller 101 is separately connected to control ends of the n equalization switches 107 to control the n equalization switches to be open or closed. The controller 101 controls, based on a sampling voltage value of each single cell that is collected by a sampling circuit and a preset battery equalization algorithm, connection of an equalization switch 107 of a single cell that needs to be equalized, so that electric energy of the single cell that needs to be equalized is released by using the equalization resistor 108.

The equalization switch may include a fifth transistor, a second opto-isolator, and a first resistor. The fifth transistor may be an NMOS.

A first port of the fifth transistor of any one of the n equalization switches is connected to a first port of the second opto-isolator by using the first resistor, a second port of the fifth transistor is connected to the first port of the second opto-isolator, and a third port of the fifth transistor is connected to a fourth port of the second opto-isolator by using the equalization resistor. The first port of the second opto-isolator is connected to a negative electrode of a single cell corresponding to the second opto-isolator, a second port of the second opto-isolator is grounded, a third port of the second opto-isolator is connected to the second output group of the controller, and the fourth port of the second opto-isolator is connected to a positive electrode of the single cell corresponding to the second opto-isolator.

Figure 7:
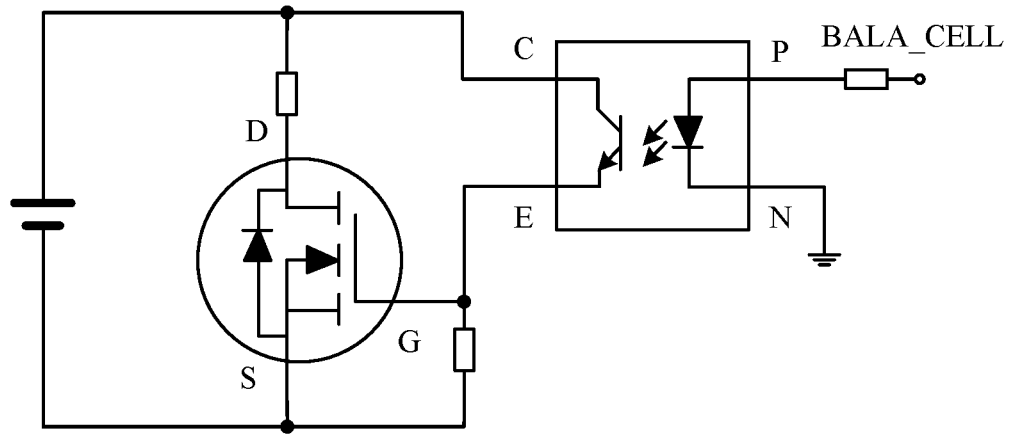
FIG. 7 is a schematic structural diagram of an equalization switch according to an embodiment of the present invention.

In a structure of an equalization switch shown in FIG. 7, a first port S of a fifth transistor of the equalization switch is connected to a first port E of a second opto-isolator by using a first resistor, a second port G of the fifth transistor is connected to the first port E of the second opto-isolator, and a third port D of the fifth transistor is connected to a fourth port C of the second opto-isolator by using the equalization resistor. The first port E of the second opto-isolator is connected to a negative electrode of a single cell corresponding to the second opto-isolator, a second port N of the second opto-isolator is grounded, a third port P of the second opto-isolator is connected to the second output group BALA_CELL of the controller, and the fourth port C of the second opto-isolator is connected to a positive electrode of the single cell corresponding to the second opto-isolator.

Correspondingly, this embodiment of the present invention further provides an equalization switch that includes a PMOS, an opto-isolator, and a second resistor. In this embodiment of the present invention, a sixth transistor is a PMOS.

Any one of the n equalization switches includes a sixth transistor, a second opto-isolator, and a second resistor. A first port of the sixth transistor is connected to a first port of the second opto-isolator by using the second resistor, a second port of the sixth transistor is connected to the first port of the second opto-isolator, and a third port of the sixth transistor is connected to a fourth port of the second opto-isolator by using the equalization resistor. The first port of the second opto-isolator is connected to a positive electrode of a single cell corresponding to the second opto-isolator, a second port of the second opto-isolator is grounded, a third port of the second opto-isolator is connected to the second output group of the controller, and the fourth port of the second opto-isolator is connected to a negative electrode of the single cell corresponding to the second opto-isolator.

Figure 8:
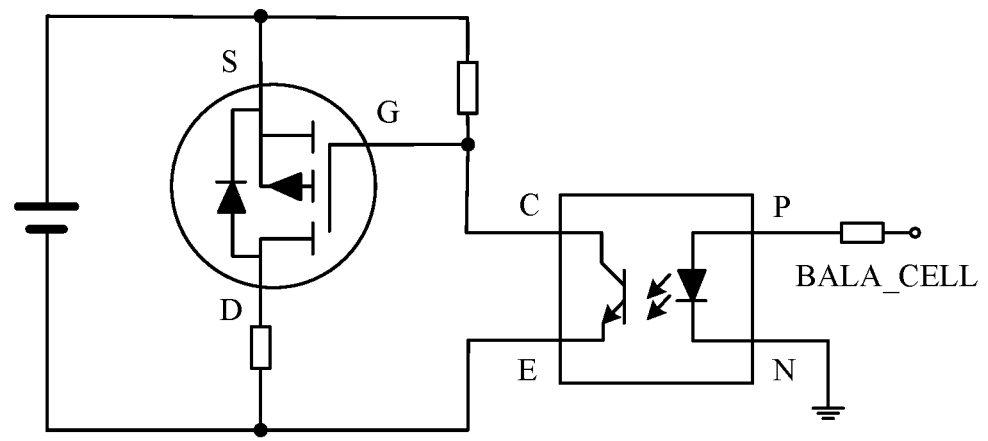
FIG. 8 is a schematic structural diagram of another equalization switch according to an embodiment of the present invention.

In a structure of an equalization switch shown in FIG. 8, a first port S of a sixth transistor of the equalization switch is connected to a first port E of a second opto-isolator by using a second resistor, a second port G of the sixth transistor is connected to the first port E of the second opto-isolator, and a third port D of the sixth transistor is connected to a fourth port C of the second opto-isolator by using the equalization resistor. The first port E of the second opto-isolator is connected to a positive electrode of a single cell corresponding to the second opto-isolator, a second port N of the second opto-isolator is grounded, a third port P of the second opto-isolator is connected to the second output group BALA_CELL of the controller, and the fourth port C of the second opto-isolator is connected to a negative electrode of the single cell corresponding to the second opto-isolator.

Figure 9:
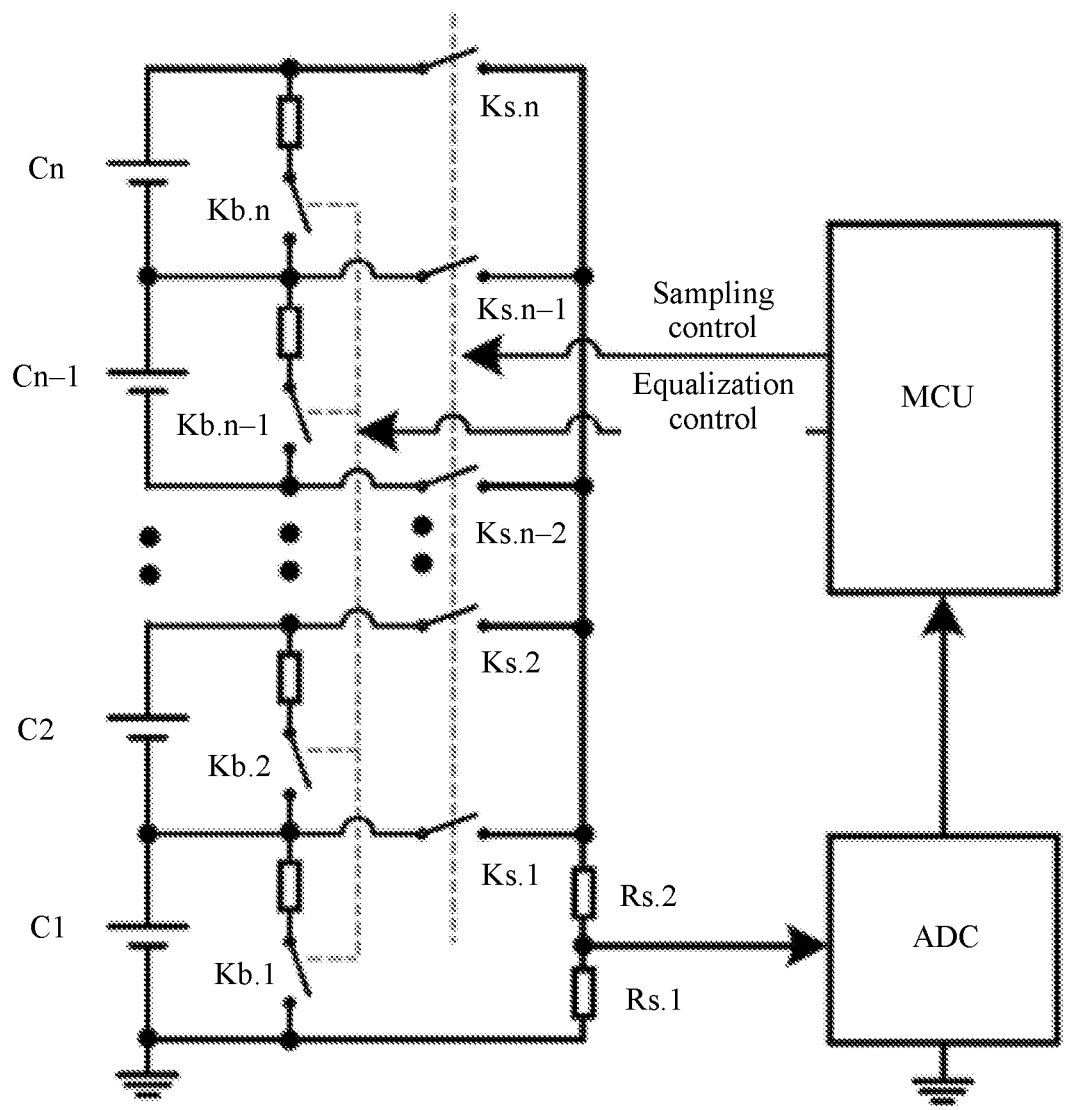
FIG. 9 is a schematic structural diagram of a sampling equalization system for a single cell in a series battery pack according to an embodiment of the present invention.

Based on a same technical concept, the equalization circuit shown in FIG. 6 may be applied to the sampling circuit shown in FIG. 1 or FIG. 5, to form a structure of a sampling equalization system for a single cell in a series battery pack shown in FIG. 9. A controller performs, based on a voltage value of each single cell that is collected by a sampling circuit and a preset battery equalization algorithm, equalization control on a single cell that needs to be equalized.

As shown in FIG. 9, a positive electrode of each single cell (C1, C2, . . . , and Cn) in a series battery pack in a sampling circuit is connected to one end of a sampling switch (Ks.1, Ks.2, . . . , and Ks.n). The other ends of sampling switches are connected together before connected to a resistor voltage divider network formed by passing through Rs.2 and Rs.1. When the sampling switches are sequentially closed (only one sampling switch is allowed to be closed at one moment), a voltage of a positive electrode of a corresponding single cell to a reference ground of the battery pack (namely, a negative electrode of C1) is applied to the resistor voltage divider network, and is sent to A/D for conversion after being attenuated by the voltage divider network. A microcontroller unit (MCU) subtracts two adjacent sampling values to obtain a voltage value of a corresponding single cell. For example, a sampling voltage Un is obtained when the switch Ks.n is closed, and a sampling voltage Un−1 is obtained when the switch Ks.n−1 is closed, and therefore an actual voltage value of the single cell Cn is Un−(Un−1). A technical solution of the present invention is a common mode voltage division sampling solution in essence. However, because of uniqueness of the resistor voltage divider network and a sampling channel, a relatively large error caused by a resistor voltage divider network and a sampling channel in a conventional common mode voltage division solution is avoided. In this solution, two adjacent sampling voltages have a basically same common mode sampling error, and the common mode error is eliminated in a process of subtracting the two collected voltages. Therefore, voltage sampling precision of a single cell is greatly improved, and can be close to a precision effect in a differential mode sampling method.

There is a parallel equalization circuit that includes a resistor and a switch (Kb.1, Kb.2, . . . , and Kb.n) that are connected in series between a positive electrode and a negative electrode of each single cell. The MCU obtains a voltage of each single cell in the battery pack by using the sampling circuit, and closes, based on a battery equalization management algorithm, an equalization switch of a single cell for which equalization discharging needs to be enabled, so as to control voltages of all the single cells to tend to be consistent.

An isolation sampling switch unit that includes an NMOS, an auxiliary driving power supply, and an opto-isolator is configured to implement a low-cost sampling switch Ks, and includes two N-channel MOSFET transistors and one auxiliary driving power supply. Source electrodes S of the two N-channel MOSFET transistors are connected to each other, gate electrodes G are connected to each other, a drain electrode D of one transistor is connected to a positive electrode of a single cell, and a drain electrode D of the other transistor is connected to a common terminal. The common terminal is connected to the voltage divider resistor network. A negative electrode of the auxiliary driving power supply is connected to the common terminal, and a positive electrode is connected to a collector C of an optical coupling transistor. A CPU (processor) may control the auxiliary driving power supply to be connected to or disconnected from the gate electrodes G of the two N-channel MOSFETs by using an isolation optocoupler, so as to control the isolation sampling switch unit that includes two NMOSs to be closed or open.

An isolation controllable sampling electronic switch unit includes a PMOS and an opto-isolator. A principle of the PMOS is similar to that of an NMOS, and a difference is that the PMOS may directly use a voltage of a single cell to close or open a switch without an auxiliary power supply.

An isolation controllable battery equalization circuit unit includes a resistor, an NMOS or a PMOS, and an opto-isolator. A driving power supply of a gate electrode of the NMOS or the PMOS is from a voltage of a corresponding single cell. The MCU can control the NMOS or the PMOS to be closed or open by using the isolation optocoupler. When a switch is closed, the single cell discharges by using a resistor and a MOSFET transistor that are connected in parallel to implement a battery equalization function.

Figure 10:
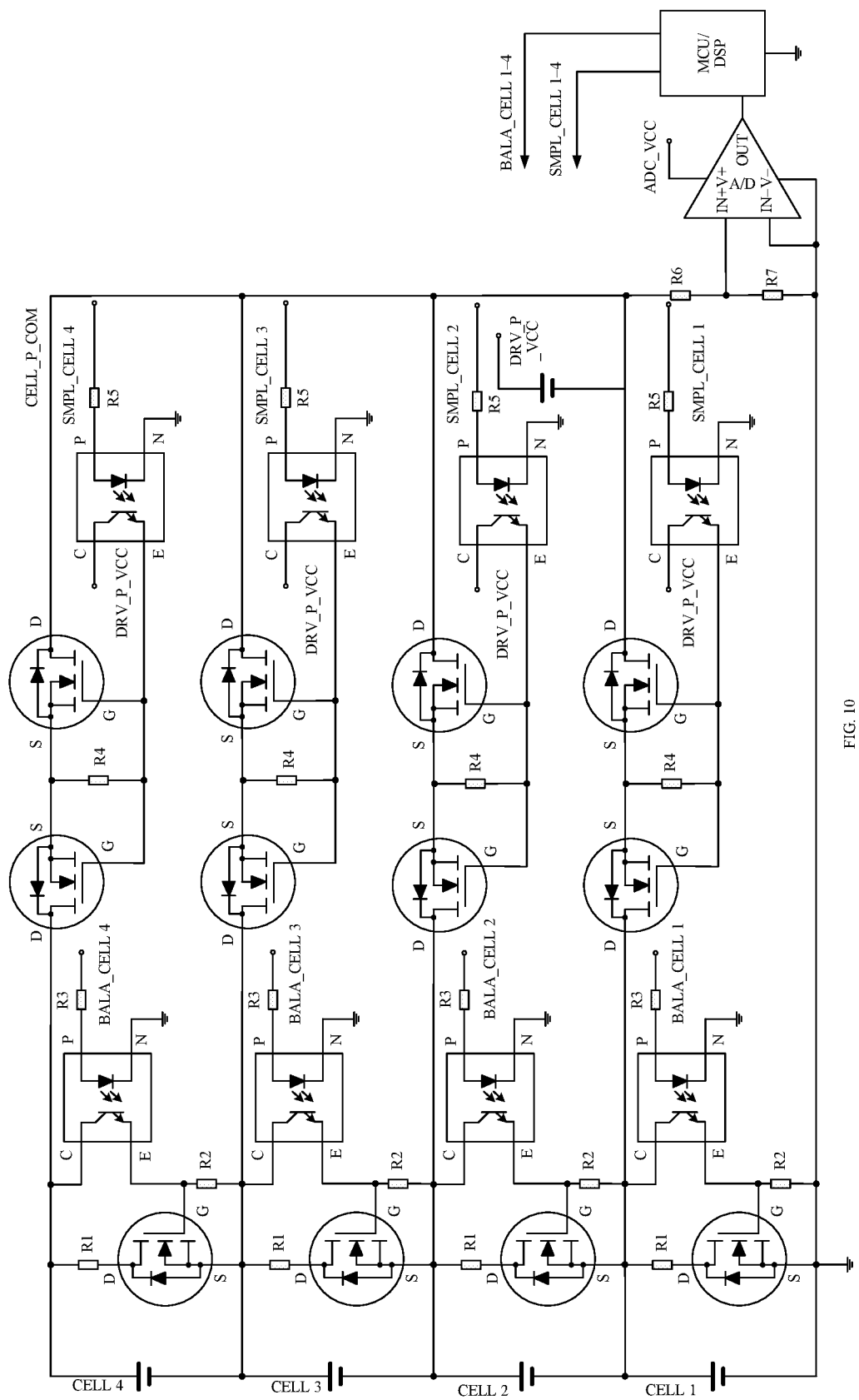
FIG. 10 is a schematic structural diagram of a sampling equalization system for a single cell in a series battery pack according to an embodiment of the present invention.
Figure 11:
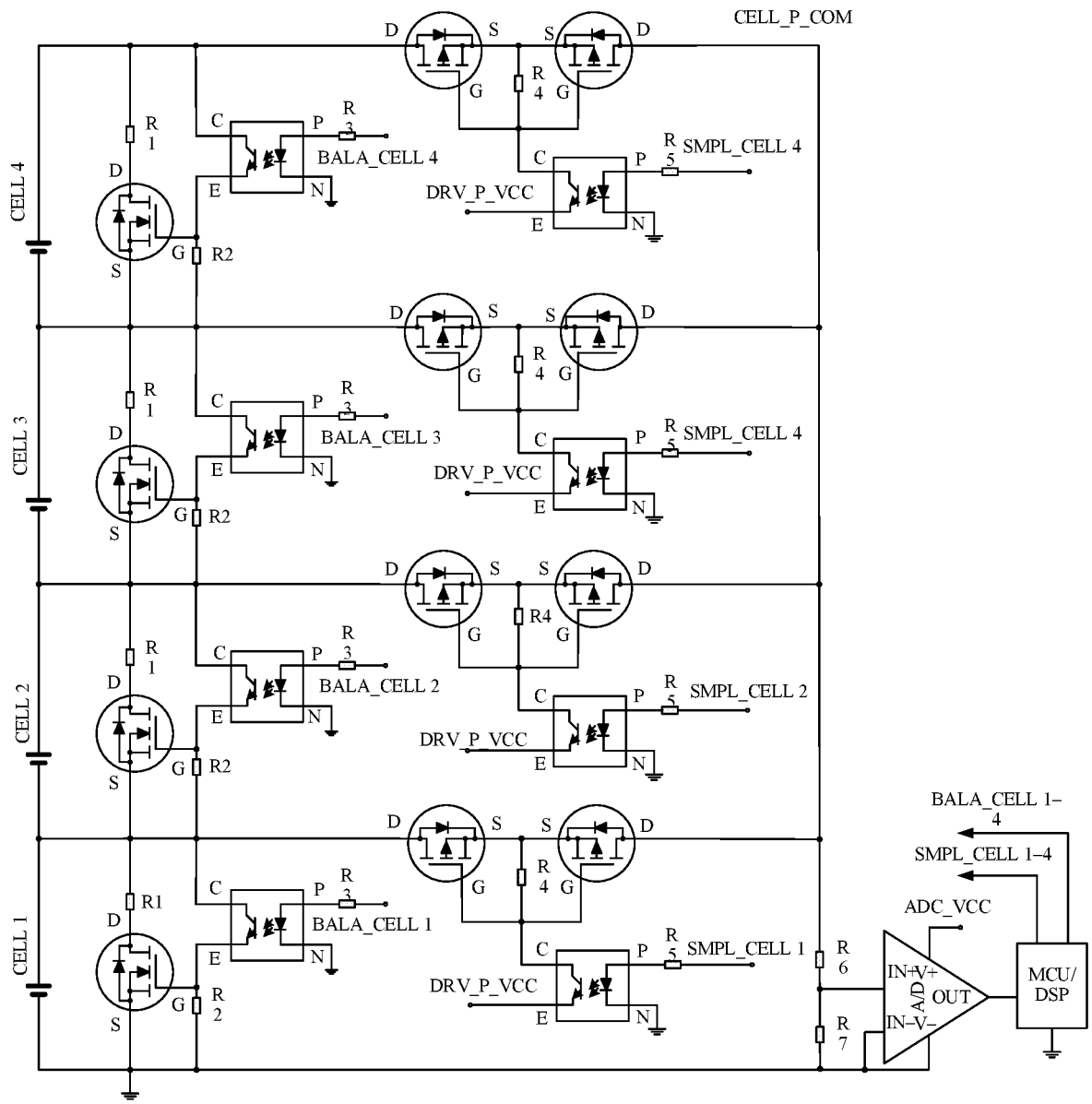
FIG. 11 is a schematic structural diagram of a sampling equalization system for a single cell in a series battery pack according to an embodiment of the present invention.

FIG. 10 and FIG. 11 each show a structure of a sampling equalization system for a single cell in a series battery pack in a common mode voltage division method. In the sampling equalization system shown in FIG. 10, an equalization switch uses an NMOS as a transistor, and an isolation sampling switch uses an NMOS as a transistor. However, in the sampling equalization system shown in FIG. 11, an equalization switch uses an NMOS as a transistor, and an isolation sampling switch uses a PMOS as a transistor. Correspondingly, the equalization switch may use a PMOS as a transistor, and the isolation sampling switch uses an NMOS as a transistor. Alternatively, the equalization switch uses a PMOS as a transistor, and the isolation sampling switch uses a PMOS as a transistor. The two examples are not shown in this embodiment of the present invention, and may be interchangeably used in an actual application process.

For example, a working principle of the sampling equalization system shown in FIG. 10 is described as follows: An NMOS, an auxiliary driving power supply, and an opto-isolator constitute an isolation controllable sampling electronic switch unit, an NMOS and an opto-isolator constitute an isolation controllable battery equalization switch unit, two resistors constitute a voltage divider network, and there is an A/D sampling circuit and an MCU unit. One end (a D electrode of one NMOS) of the sampling electronic switch unit is connected to a positive electrode of a single cell, and the other end (a D electrode of the other NMOS) is connected to a common terminal. The common terminal is connected to the voltage divider resistor network. All sampling electronic switch units share one auxiliary driving power supply. A negative electrode of the driving power supply is connected to the common terminal, and a positive electrode is separately connected to optical coupling collectors C of the corresponding sampling electronic switch units. The MCU may control the auxiliary driving power supply to be connected to and disconnected from gate electrodes G of the corresponding sampling electronic switches by using an isolation optocoupler, so as to close or open the sampling electronic switch units. The MCU sequentially closes the sampling switches to obtain a common mode voltage value of a positive electrode of each single cell to a common ground of the battery, and subtracts two adjacent sampling values to obtain a voltage value of a corresponding single chip. Because of uniqueness of a sampling channel, a common mode sampling error is eliminated in a subtraction process, and sampling precision of a single cell is close to precision in differential sampling.

The MCU starts a corresponding equalization electronic switch unit for a single cell with a high voltage based on the obtained voltage value of each single cell and a battery management algorithm, so that voltages of all the single cells tend to be consistent.

Figure 12:
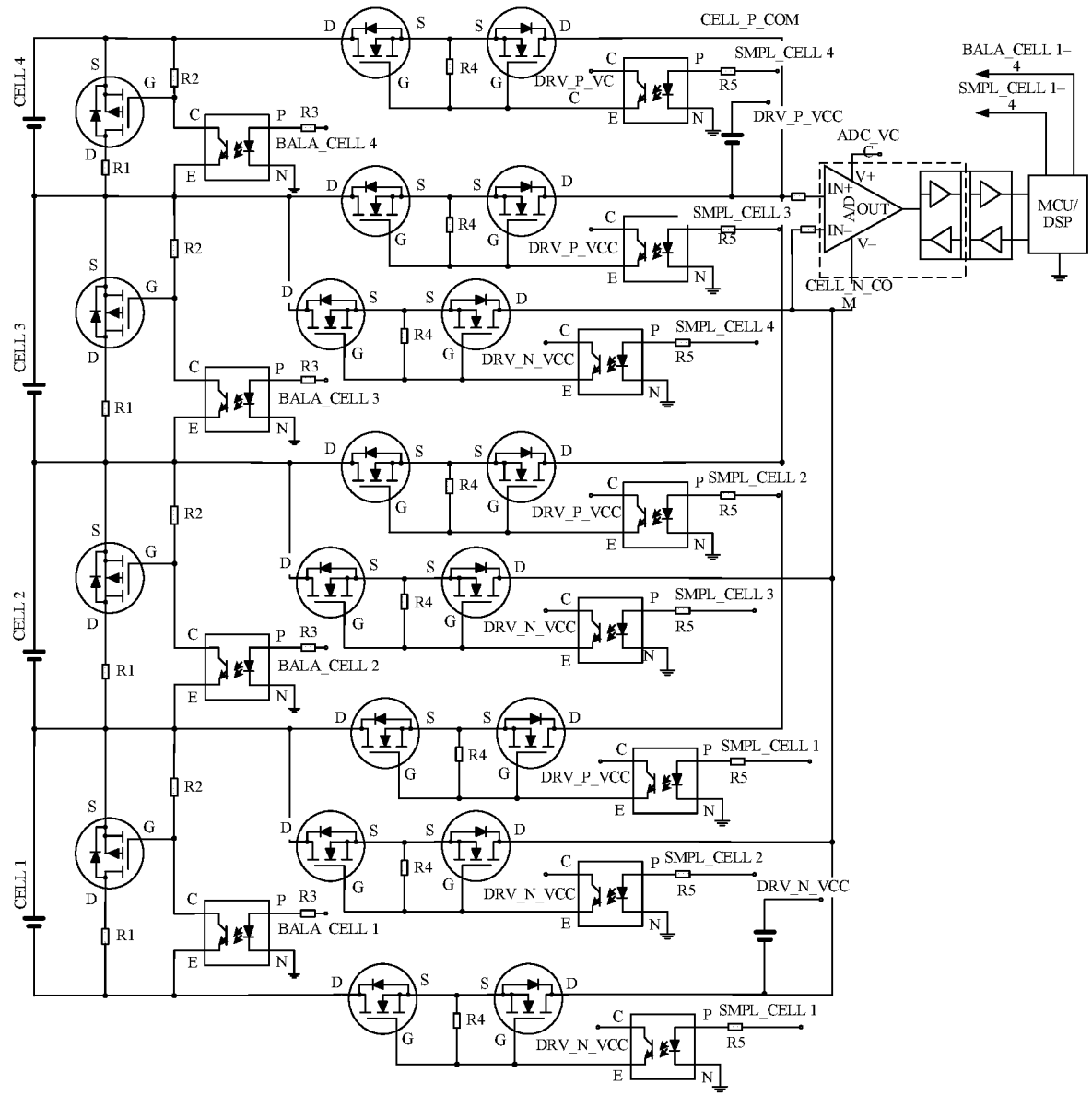
FIG. 12 is a schematic structural diagram of a sampling equalization system for a single cell in a series battery pack according to an embodiment of the present invention.
Figure 13:
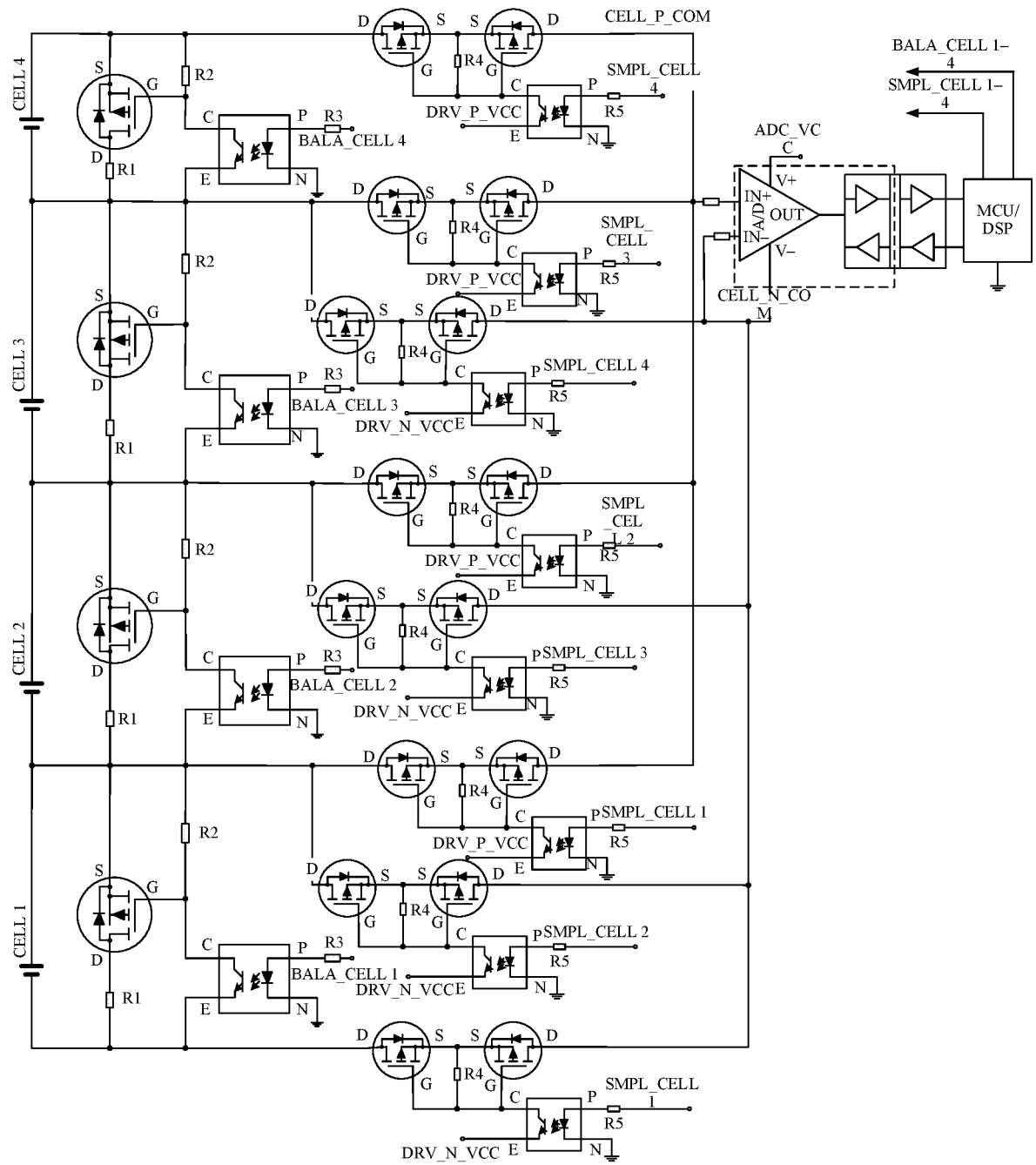
FIG. 13 is a schematic structural diagram of a sampling equalization system for a single cell in a series battery pack according to an embodiment of the present invention.

FIG. 12 and FIG. 13 separately show structures of a sampling equalization system for a single cell in a series battery pack in a differential mode sampling method. In the sampling equalization system shown in FIG. 12, an equalization switch uses a PMOS as a transistor, and an isolation sampling switch uses an NMOS as a transistor. However, in the sampling equalization system shown in FIG. 13, an equalization switch uses a PMOS as a transistor, and an isolation sampling switch uses a PMOS as a transistor. Correspondingly, the equalization switch may use an NMOS as a transistor, and the isolation sampling switch uses an NMOS as a transistor. Alternatively, the equalization switch uses an NMOS as a transistor, and the isolation sampling switch uses a PMOS as a transistor. The two examples are not shown in this embodiment of the present invention, and may be interchangeably used in an actual application process.

In the sampling equalization system shown in FIG. 12, positive electrodes of all single cells are connected to a positive electrode common terminal (CELL_P_COM) by using isolation controllable electronic switch units that include NMOSs, and negative electrodes of all the single cells are connected to a negative electrode common terminal (CELL_N_COM) by using isolation controllable electronic switch units that include NMOSs. There are two auxiliary driving power supplies, negative electrodes of the two auxiliary driving power supplies are separately connected to the positive electrode common terminal and the negative electrode common terminal, and positive electrodes of the two auxiliary driving power supplies are connected to gate electrodes G of corresponding switch units by using an isolation optocoupler. The positive electrode common terminal and the negative electrode common terminal are respectively connected to a positive electrode and a negative electrode of an A/D sampling circuit. When an MCU controls a positive sampling electronic switch unit and a negative sampling electronic switch unit of a corresponding single cell to be closed at a same moment, a voltage of the single cell is directly sent to the A/D sampling circuit. In this way, high-precision differential sampling of a voltage of each single cell can be implemented. The A/D sampling circuit sends a sampling result to the MCU by isolating communication, and then the MCU controls an equalization electronic switch to equalize the voltage of the single cell.

In this embodiment of the present invention, a common mode voltage sampling method described in the present invention is used, so that sampling precision equivalent to that of a professional battery management chip and in a differential mode sampling method can be obtained. In addition, costs are significantly reduced, and a price/performance ratio of the solution is high.

Both an MOS transistor and an opto-isolator included in the isolation controllable electronic switch are mature components in the industry, and have high reliability and a huge cost advantage in comparison with a dedicated chip, a mechanical relay, and a solid state relay.

In the voltage sampling and equalization circuits for a single cell in a series battery cell that include discrete components, application configurations are flexible, and are not limited by a quantity of batteries. There is flexibility in terms of voltage withstanding of an electronic switch, and there are no limitations such as a power-on time sequence and software configuration of a dedicated chip. In addition, there are few additional costs, and reliability is higher.

Battery sampling precision is determined by an A/D chip, and there are more choices when the A/D chip is compared with A/D in the dedicated chip, and precision of an entire A/D sampling channel may be further improved through digital calibration.

A person skilled in the art can make various modifications and variations to embodiments of the present invention without departing from the spirit and scope of this application. This application is intended to cover these modifications and variations to embodiments of the present invention provided that they fall within the scope of protection of this application defined by the following claims and their equivalent technologies.

Additionally, statements made herein characterizing the invention refer to an embodiment of the invention and not necessarily all embodiments.

What is claimed is:

1. A system, comprising:
   a controller;
   an analog-to-digital converter (ADC);
   a bleeder circuit;
   a battery pack including n single cells connected in series;
   n isolation sampling switches; and
   an auxiliary driving power supply;
   wherein one end of each of the n isolation sampling switches is connected to a first input of the bleeder circuit, the other end of each of the n isolation sampling switches is connected to a positive electrode of a respective single cell of the n single cells, and the isolation sampling switches are in a one-to-one correspondence with the single cells;
   wherein a negative electrode of a first single cell of the n single cells is connected to a second input of the bleeder circuit, and is grounded;

wherein an output of the bleeder circuit is connected to a second input of the ADC, a first input of the ADC is grounded, and an output of the ADC is connected to an input of the controller;

wherein a first output group of the controller is separately connected to control ends of the n isolation sampling switches to control the n isolation sampling switches to be open or closed;

wherein the controller is configured to sequentially control the n isolation sampling switches to be closed, so as to send voltages to earth of the positive electrodes of the n single cells corresponding to the n isolation sampling switches to the ADC for conversion after the voltages to earth are attenuated by the bleeder circuit;

wherein the ADC is configured to transmit converted sampling voltage values to the controller;

wherein the controller is configured to subtract two adjacent sampling voltage values to obtain a voltage value of a corresponding single cell;

wherein at least one isolation sampling switch of the n isolation sampling switches comprises a first transistor, a second transistor, and an opto-isolator;

wherein a first port of the first transistor is connected to a first port of the second transistor, a second port of the first transistor is connected to a first port of the opto-isolator, and a third port of the first transistor is connected to a positive electrode of a single cell corresponding to the first transistor;

wherein a second port of the second transistor is connected to the first port of the opto-isolator, and a third port of the second transistor is connected to the first input of the bleeder circuit;

wherein a second port of the opto-isolator and the controller are common-grounded, a third port of the opto-isolator is connected to the first output group of the controller, and a fourth port of the opto-isolator is connected to a positive electrode of the auxiliary driving power supply; and wherein a negative electrode of the auxiliary driving power supply is connected to the first input of the bleeder circuit.

2. The system according to claim 1, wherein the bleeder circuit comprises a first voltage divider resistor and a second voltage divider resistor;

wherein one end of the first voltage divider resistor is connected to the n isolation sampling switches, and the other end of the first voltage divider resistor is connected to the second input of the ADC; and wherein one end of the second voltage divider resistor is connected to the negative electrode of the first single cell of the n single cells, and the other end of the second voltage divider resistor is connected to the second input of the ADC.

3. The system according to claim 1, wherein the first transistor and the second transistor are N-channel metal oxide semiconductors.

4. The system according to claim 1, wherein at least one other isolation sampling switch of the n isolation sampling switches comprises a third transistor, a fourth transistor, and a second opto-isolator;

wherein a first port of the third transistor is connected to a first port of the fourth transistor, a second port of the third transistor is connected to a fourth port of the second opto-isolator, and a third port of the third transistor is connected to a positive electrode of a single cell corresponding to the third transistor;

wherein a second port of the fourth transistor is connected to the fourth port of the second opto-isolator, and a third port of the fourth transistor is connected to the first input of the bleeder circuit; and wherein a first port of the second opto-isolator is connected to a negative electrode of a single cell corresponding to the second opto-isolator, a second port of the second opto-isolator and the controller are common-grounded, and a third port of the second opto-isolator is connected to the first output group of the controller.

5. The system according to claim 4, wherein the third transistor and the fourth transistor are P-channel metal oxide semiconductors.

6. A system, comprising:
a controller;
an analog-to-digital converter (ADC) with communication isolation;
a battery pack including n single cells connected in series;
n first isolation sampling switches;
n second isolation sampling switches; and
an auxiliary driving power supply;

wherein one end of each of the n first isolation sampling switches is connected to a first input of the ADC with communication isolation, the other end of each of the n first isolation sampling switches is connected to a positive electrode of a respective single cell of the n single cells, and the first isolation sampling switches are in a one-to-one correspondence with the single cells;

wherein one end of each of the n second isolation sampling switches is connected to a second input of the ADC with communication isolation, the other end of each of the n second isolation sampling switches is connected to a negative electrode of a respective single cell of the n single cells, and the second isolation sampling switches are in a one-to-one correspondence with the single cells;

wherein an output of the ADC with communication isolation is connected to an input of the controller;

wherein a first output group of the controller is separately connected to control ends of the n first isolation sampling switches and control ends of the n second isolation sampling switches to control the n first isolation sampling switches and the n second isolation sampling switches to be open or closed; and wherein the controller is configured to sequentially control closure of the first isolation sampling switches and the second isolation sampling switches that are connected to all the single cells, so as to sequentially send voltages of all the single cells to the ADC with communication isolation for conversion;

wherein sampling voltage values of all the single cells that are converted by the ADC are isolated;

wherein the ADC is configured to transmit the sampling voltage values of all the single cells that are converted by the ADC to the controller;

wherein at least one isolation sampling switch of the n first isolation sampling switches and the n second isolation sampling switches comprises a first transistor, a second transistor, and an opto-isolator;

wherein a first port of the first transistor is connected to a first port of the second transistor, a second port of the first transistor is connected to a first port of the opto-isolator, and a third port of the first transistor is connected to a positive electrode of a single cell corresponding to the first transistor;

wherein a second port of the second transistor is connected to the first port of the opto-isolator, and a third port of the second transistor is connected to a first input of a bleeder circuit;

wherein a second port of the opto-isolator and the controller are common-grounded, a third port of the opto-isolator is connected to the first output group of the controller, and a fourth port of the opto-isolator is connected to a positive electrode of the auxiliary driving power supply; and wherein a negative electrode of the auxiliary driving power supply is connected to the second input of the ADC.

7. The system according to claim 6, wherein the first transistor and the second transistor are N-channel metal oxide semiconductors.

8. The system according to claim 6, wherein at least one other isolation sampling switch of the n first isolation sampling switches and the n second isolation sampling switches comprises a third transistor, a fourth transistor, and a second opto-isolator;

wherein a first port of the third transistor is connected to a first port of the fourth transistor, a second port of the third transistor is connected to a fourth port of the second opto-isolator, and a third port of the third transistor is connected to a positive electrode of a single cell corresponding to the third transistor;

wherein a second port of the fourth transistor is connected to the fourth port of the second opto-isolator, and a third port of the fourth transistor is connected to a first input of a bleeder circuit; and wherein a first port of the second opto-isolator is connected to a negative electrode of a single cell corresponding to the second opto-isolator, a second port of the second opto-isolator and the controller are common-grounded, and a third port of the second opto-isolator is connected to the first output group of the controller.

9. The system according to claim 8, wherein the third transistor and the fourth transistor are P-channel metal oxide semiconductors.

10. A system, comprising:
a controller;
a battery pack including n single cells connected in series;
n equalization switches; and
n equalization resistors;
wherein at least one of the n single cells is connected in series to one equalization switch and one equalization resistor;
wherein a second output group of the controller is separately connected to control ends of the n equalization switches to control the n equalization switches to be open or closed; and
wherein the controller is configured to control, based on a sampling voltage value of each single cell that is collected by a sampling circuit, connection of an equalization switch of a single cell that needs to be equalized, so that electric energy of the single cell that needs to be equalized is released by using an equalization resistor;
wherein at least one equalization switch of the n equalization switches comprises a fifth transistor, a second opto-isolator, and a first resistor;

wherein a first port of the fifth transistor is connected to a first port of the second opto-isolator by using the first resistor, a second port of the fifth transistor is connected to the first port of the second opto-isolator, and a third port of the fifth transistor is connected to a fourth port of the second opto-isolator by using the equalization resistor; and wherein the first port of the second opto-isolator is connected to a negative electrode of a single cell corresponding to the second opto-isolator, a second port of the second opto-isolator is grounded, a third port of the second opto-isolator is connected to the second output group of the controller, and the fourth port of the second opto-isolator is connected to a positive electrode of the single cell corresponding to the second opto-isolator.

11. The system according to claim 10, wherein
the fifth transistor is an N-channel metal oxide semiconductor.

12. A system, comprising:
a controller;
a battery pack including n single cells connected in series;
n equalization switches; and
n equalization resistors;
wherein at least one of the n single cells is connected in series to one equalization switch and one equalization resistor;
wherein a second output group of the controller is separately connected to control ends of the n equalization switches to control the n equalization switches to be open or closed;
wherein the controller is configured to control, based on a sampling voltage value of each single cell that is collected by a sampling circuit, connection of an equalization switch of a single cell that needs to be equalized, so that electric energy of the single cell that needs to be equalized is released by using an equalization resistor;
wherein at least one equalization switch of the n equalization switches comprises a sixth transistor, a second opto-isolator, and a second resistor;
wherein a first port of the sixth transistor is connected to a first port of the second opto-isolator by using the second resistor, a second port of the sixth transistor is connected to the first port of the second opto-isolator, and a third port of the sixth transistor is connected to a fourth port of the second opto-isolator by using the equalization resistor; and
wherein the first port of the second opto-isolator is connected to a positive electrode of a single cell corresponding to the second opto-isolator, a second port of the second opto-isolator is grounded, a third port of the second opto-isolator is connected to the second output group of the controller, and the fourth port of the second opto-isolator is connected to a negative electrode of the single cell corresponding to the second opto-isolator.

13. The system according to claim 12, wherein the sixth transistor is a P-channel metal oxide semiconductor.

* * * * *